US006285223B1

(12) United States Patent
Smith

(10) Patent No.: US 6,285,223 B1
(45) Date of Patent: Sep. 4, 2001

(54) POWER-UP CIRCUIT FOR ANALOG CIRCUITS

(75) Inventor: Malcolm H. Smith, Macungie, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/571,912

(22) Filed: May 16, 2000

(51) Int. Cl.$^7$ .............................. H03L 7/00

(52) U.S. Cl. .............................. 327/143

(58) Field of Search .............................. 327/142, 143, 327/538, 543

(56) References Cited

U.S. PATENT DOCUMENTS

| | | | | |
|---|---|---|---|---|
| 6,107,789 | * | 8/2000 | Fryer et al. | 323/316 |
| 6,163,468 | * | 12/2000 | Barnes | 363/49 |
| 6,191,644 | * | 2/2001 | Srinath et al. | 327/539 |

* cited by examiner

*Primary Examiner*—Jeffrey Zweizig
(74) *Attorney, Agent, or Firm*—Schnader Harrison Segal & Lewis LLP

(57) ABSTRACT

A start-up circuit for supplying current to an analog circuit. The start-up circuit comprises a capacitor connected to a current mirror. A power-up signal input to the start-up circuit causes the capacitor to discharge to the current mirror thereby causing the current mirror to provide a current to the analog circuit.

15 Claims, 3 Drawing Sheets

POWER-UP CIRCUIT FOR ANALOG CIRCUITS

FIELD OF THE INVENTION

This invention relates to a start-up circuit particularly useful in conjunction with a low power analog circuit.

BACKGROUND OF THE INVENTION

Low power systems having relatively small currents flowing therein, typically use sleep states in which circuit portions are powered down when not needed to conserve battery charge. Charging capacitors in the circuit up to operating voltage using these small currents requires long periods of time. To overcome the problem of slow power-up, a node to be charged may be brought to power supply voltage through a sufficiently large transistor for an amount of time dictated by a clock. Upon expiration of the appropriate time period, the charging is ceased and the circuit is allowed to settle back to the operating level. The disadvantage of pulling the node to a supply voltage to power-up a circuit is that it has to settle down afterwards. This may take considerable time if the currents available are relatively small. A further disadvantage is that the circuit requires a clock adding additional circuitry and hence consuming additional power.

Another method known to increase power-up speed includes using a kick-start circuit to pump current into a circuit to be powered up. The kick-start circuit provides current to transistors in the circuit being powered up. When the transistors are charged sufficiently, a transistor that produces a logic signal is turned on. The signal then turns the kick-start circuit off, leaving the attached circuitry in a powered-up state.

The disadvantage of a kick-start circuit is that charge pumped into the circuit to be powered up is not related to the amount of charge required to charge the capacitor in the kick-start circuit. Therefore, the kick-start circuit may overshoot the desirable level of charge, and hence, a period of settling down may be necessary.

FIG. 1 depicts a known start-up circuit 100 used in conjunction with a voltage reference circuit 102. Start-up circuit 100 is shown by dotted lines. Voltage reference circuit 102 has two possible equilibrium points, one of which corresponds to zero voltage and zero current, and a second, non-zero equilibrium point, which corresponds to a useful reference voltage. Therefore, voltage reference circuit 102 must be designed to choose only the non-zero equilibrium point to establish the reference voltage. Start-up circuit 100 is provided to allow voltage reference circuit 102 to utilize only the desired equilibrium point. If voltage reference circuit 102 is at the undesired equilibrium point, the voltage is zero and therefore, $I_1$ and $I_2$ are zero. Consequently, transistor 104 provides current in transistor 106 which then moves voltage reference circuit 102 to the non-zero equilibrium point. Transistor 104's source voltage increases as the desired equilibrium point is approached. This causes the current through transistor 104 to decrease. When voltage reference circuit 102 reaches the non-zero equilibrium point, the current through transistor 106 will be substantially the same as the current through transistor 108. Transistor 110 and resistor 112 set the gate bias voltage for transistor 104. Voltage reference circuit 102 is on within a gate bias voltage window. Therefore, the gate bias voltage must be high enough to turn voltage reference circuit 102 on but must not exceed the upper limit of the voltage window.

FIG. 2 depicts a kick-start circuit. When current flows in the transistors of the main part of the circuit or band gap reference, the kick-start circuit is turned off. This occurs because MP4 mirrors the current into MN6 which drives the gate of MN3 high and pulls down the drain node of MN3. Driving this node low turns off the current mirrors in the kick-start circuit, so it stops sourcing and sinking current to the band gap reference circuit. R3 ensures that current flows in the kick-start circuit when the band gap reference circuit is powered down.

Conventional circuits do not provide the accuracy and speed desirable to power-up low power systems. Accordingly, there is a need for a start-up circuit that provides a targeted current quickly without significantly overshooting or falling short of the targeted value.

SUMMARY OF THE INVENTION

A start-up circuit is disclosed for supplying current to an analog circuit. The start-up circuit provides current to an analog circuit quickly and accurately. The start-up circuit comprises a capacitor connected to a current mirror. Upon a power-up signal input to the start-up circuit the capacitor discharges through the reference transistor of the current mirror. The capacitor discharge causes the current mirror to provide a current to the analog circuit.

DETAILED DESCRIPTION OF THE INVENTION

Embodiments of the invention provide a start-up circuit that powers-up an analog circuit more quickly and accurately than conventional methods. The start-up circuit includes a capacitor, preferably in the form of a transistor, one plate of which is connected to a positive terminal of a power supply, the other to a negative terminal of the power supply. The capacitor begins charging to the power supply voltage upon input of a power-down signal to the start-up circuit. When the power-down signal is withdrawn, the capacitor is discharged through a diodeconnected transistor. The diode-connected transistor forms the reference half of a current mirror. Current mirrored in a second transistor is used to charge one or more internal nodes of the analog circuit being powered up. The current mirror produces a high current relative to that which is input to the current mirror. The current output from the current mirror trails off to zero, thus charging internal nodes quickly, generally without long-term current drain.

In one embodiment of the start-up circuit a means for receiving a power-down signal is provided. The receiving means charges to a power supply voltage and discharges to a means for providing a reference current. The current of the reference means is mirrored by a current mirroring means.

The current mirroring means then provides current to charge one or more nodes of the analog circuit.

The receiving means is preferably a transistor and the current mirror reference means is preferably a diode-connected transistor.

Figure 1:
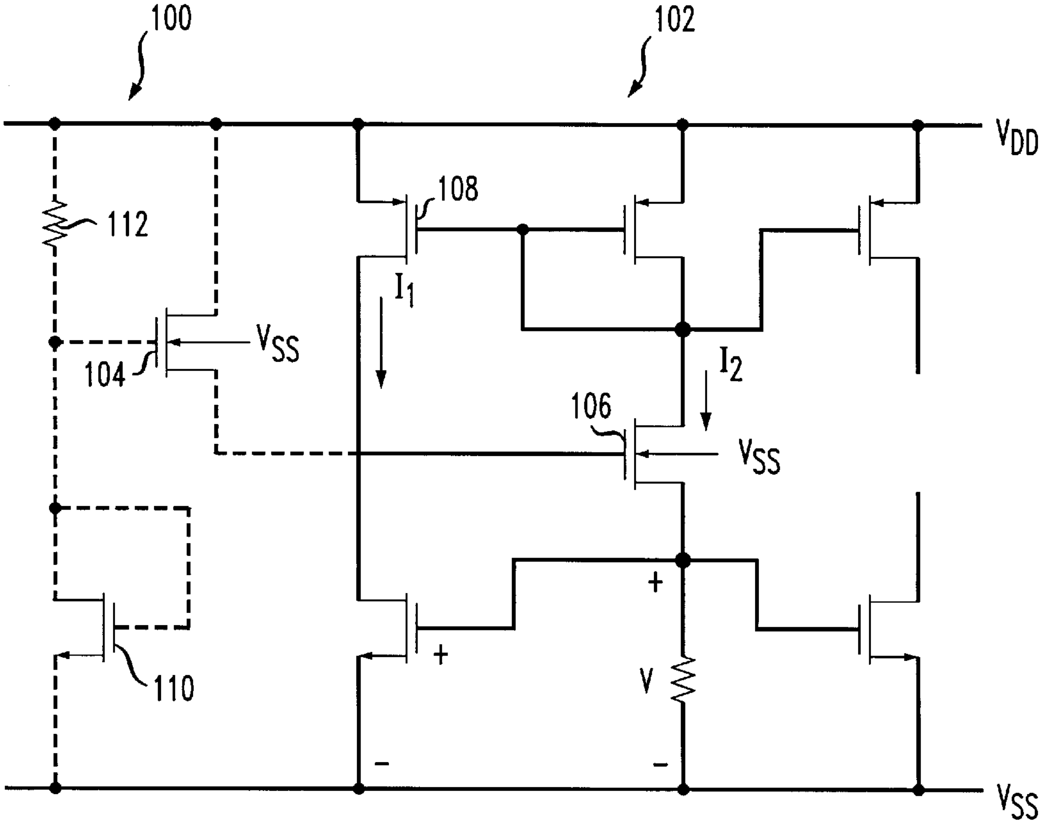
FIG. 1 PRIOR ART
FIG. 1 depicts a prior art start-up circuit.
Figure 2:
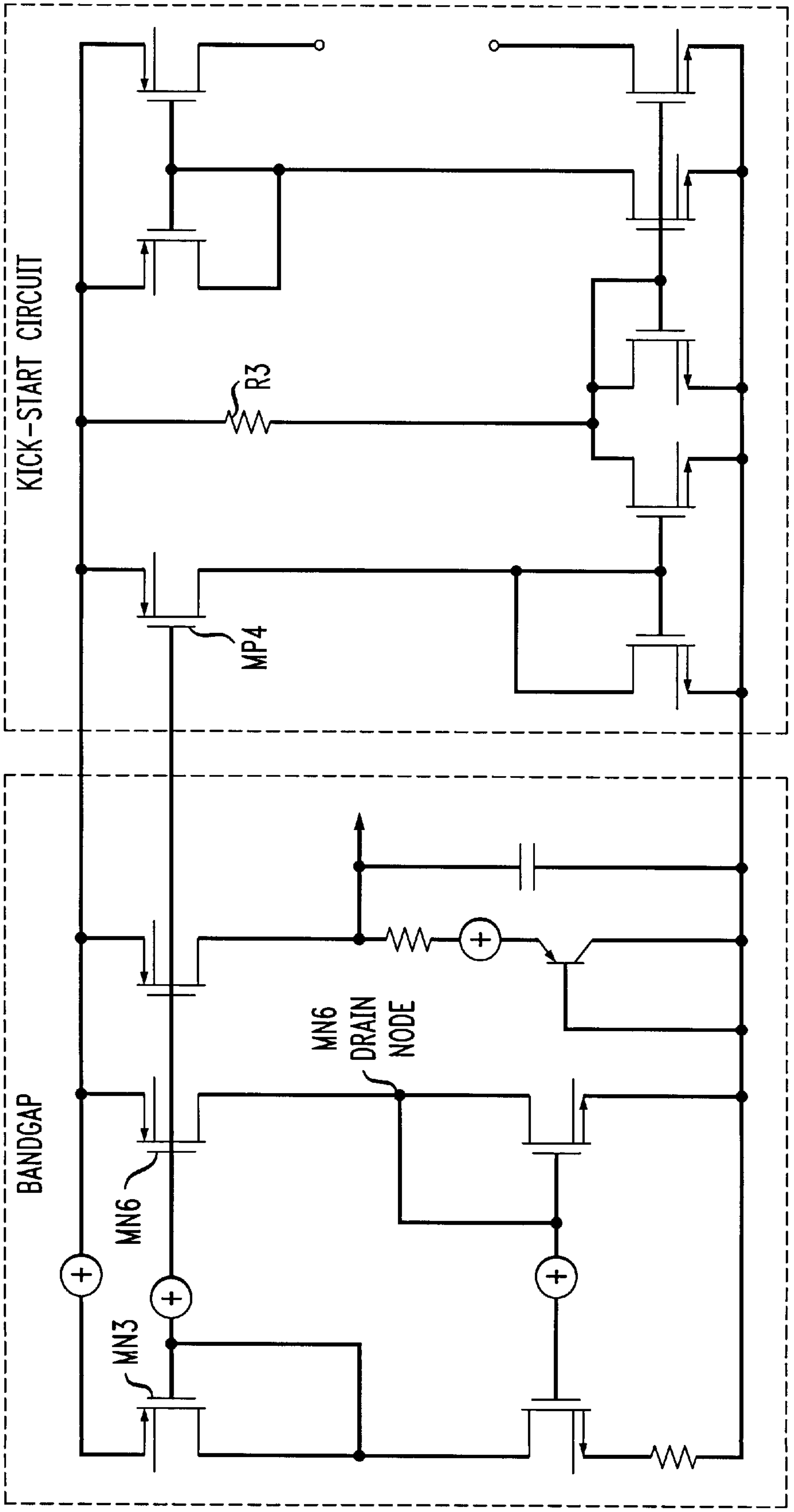
FIG. 2 PRIOR ART
FIG. 2 depicts another prior art start-up circuit.
Figure 3:
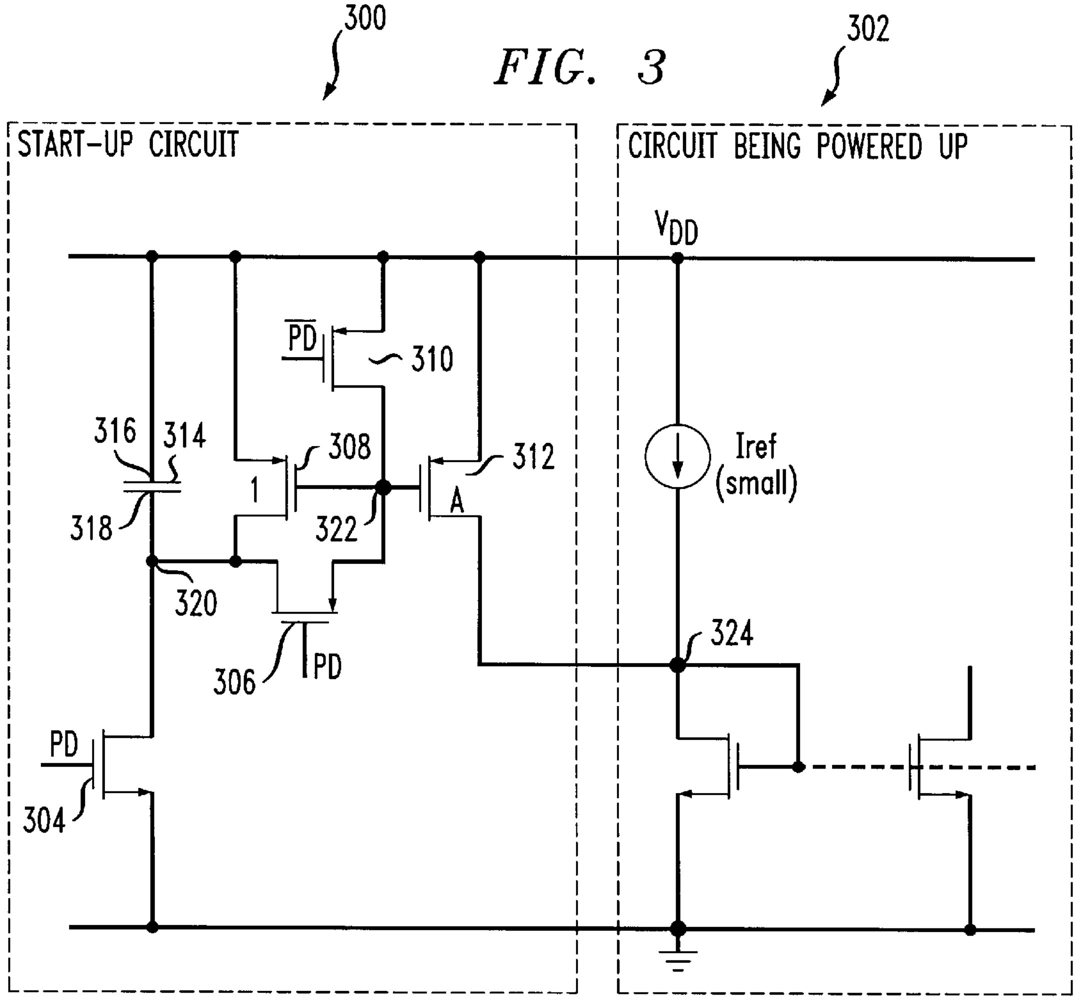
FIG. 3 depicts one embodiment of the invention.

FIG. 3 depicts one embodiment of start-up circuit 300 for providing current to analog circuit 302 in response to a power-down signal. Start-up circuit 300 comprises a plurality of transistors. The particular embodiment depicted in FIG. 3 comprises five transistors 304, 306, 308, 310 and 312, each having a gate, a source and a drain, and capacitor 314 having a first electrode 316 and a second electrode 318. First capacitor electrode 316 receives an input voltage and second capacitor electrode 318 is connected in series to the drain of first transistor 304. The source of first transistor 304 is connected to ground and the gate of first transistor 304 receives a power down signal input. Second capacitor electrode 318 is further connected to the drain of second transistor 306 and the drain of second transistor 306 is further connected to the drain of third transistor 308. The gate of second transistor 306 receives the power-down signal. The source of third transistor 308 is connected to the source of fourth transistor 310 and the source of fourth transistor 310 receives a voltage input. The drain of fourth transistor 310 is connected to the gates of transistors 308 and 312. The gate of fourth transistor 310 receives an inverted power-down signal. The gate of fifth transistor 312 is further connected to the gate of third transistor 308 and the source of fifth transistor 312 receives a voltage input. The drain of fifth transistor 312 provides a start-up current to circuit 302 being powered-up.

In the power-down mode, node 320 is pulled to ground while 322 is pulled to VDD, so no current flows in the circuit. Upon power-up, transistor 304 turns off so that node 320 is disconnected from ground and transistor 306 turns on, connecting node 320 to node 322. This causes the charge C on capacitor 314 to be discharged through transistor 308 and the current flowing through transistor 308 to be mirrored in transistor 312. Current flowing through transistor 312 is larger than that flowing through transistor 308 by a factor of A. A is equal to the differences in the channel-width-to-channel-length ratios (W/L ratios) of transistors 308 and 312. The current from transistor 312 causes node 324 to be pulled up. By using a transistor for the capacitor and adjusting the current ratio of transistors 308 and 312, a charge can be established to power-up the analog circuitry more quickly and accurately than in conventional circuits. The transistor's capacitance is set by the oxide thickness of the transistor gate which matches the capacitance of the other current mirror transistor gate, allowing the charge to be more precisely mirrored into the nodes to be powered-up than if a non-transistor capacitor is used.

It is also possible to mirror several currents by using other transistors apart from transistor 312 to power-up several different parts of an analog circuit or several circuits at the same time.

Embodiments of the start-up circuit may be used in conjunction with analog circuits in which it is desirable to power-up the circuit more quickly and accurately than is possible with conventional circuits. In one embodiment the start-up circuit is used to power a band gap reference circuit and in another embodiment it is used to power a current steering circuit for a digital to analog conversion circuit. Embodiments of the start-up circuit may be incorporated into a semiconductor device.

The start-up circuit is simple, consumes substantially no power in its quiescent state, and because it generates current to charge the capacitors of an analog circuit based on the charge on the capacitor, the circuit can, with careful rationing, transfer the desired amount of charge to bring the circuit up but not overshoot the desired level of current.

While the invention has been described in what is presently considered to be preferred embodiments, many variations and modifications will become apparent to those skilled in the art. Accordingly, it is intended that the invention not be limited to the specific illustrative embodiments but be interpreted within the full spirit and scope of the appended claims.

What is claimed is:

1. A start-up circuit for supplying current to an analog circuit comprising:

a capacitor connected to a current mirror, where upon a power-up signal input to the start-up circuit causes the capacitor to discharge to the current mirror, thereby causing the current mirror to provide a current to the analog circuit.

2. A semiconductor device comprising a start-up circuit as in claim 1.

3. A start-up circuit for providing a current to an analog circuit in response to a power-down signal wherein the start-up circuit comprises:

at least five transistors each having a gate, a drain and a source;

a capacitor having a first electrode and a second electrode, the first capacitor electrode receiving an input voltage and the second capacitor electrode connected in series to the first transistor drain;

the first transistor source connected to ground;

the first transistor gate receiving a power-down signal input;

the second capacitor electrode further connected to the second transistor drain;

the second transistor drain further connected to the third transistor drain;

the second transistor gate receiving the power-down signal;

the third transistor source connected to the fourth transistor source;

the fourth transistor source receiving a voltage input;

the fourth transistor drain connected to the fifth transistor gate and to the third transistor gate;

the fourth transistor gate receiving an inverted power-down signal;

the fifth transistor gate further connected to the third transistor gate;

the fifth transistor source receiving a voltage input; and the fifth transistor drain providing a start-up current to the analog circuit.

4. The start-up circuit of claim 1 wherein the capacitor is a transistor.

5. The start-up circuit of claim 1 wherein the start-up circuit is used to power a low power analog circuit.

6. The start-up circuit of claim 1 wherein the start-up circuit is used to power a band gap reference circuit.

7. The start-up circuit of claim 1 wherein the start-up circuit is used to power a current steering circuit for a digital to analog conversion circuit.

8. The start-up circuit of claim 3 wherein the current flowing through the fifth transistor is larger than the current flowing through the third transistor by a factor equal to the channel-width-to-channel-length-ratio of the third and fifth transistors.

9. A start-up circuit for supplying current to an analog circuit comprising:

means for receiving a power-down signal, the receiving means charging to a voltage;

means for providing a reference current wherein the reference current means is supplied with a current from the receiving means; and means for mirroring current from the reference means;

wherein the current mirroring means charges one or more nodes of the analog circuit.

10. The start-up circuit of claim 9 wherein the receiving means is a transistor.

11. The start-up circuit of claim 9 wherein the current mirror reference means is a diode-connected transistor.

12. The start-up of claim 9 wherein the start-up circuit is used to power a low power analog circuit.

13. The start-up circuit of claim 9 wherein the start-up circuit is used to power a band gap reference circuit.

14. The start-up circuit of claim 9 wherein the start-up circuit is used to power a current steering circuit for a digital to analog conversion circuit.

15. A semiconductor device comprising a start-up circuit as in claim 9.

* * * * *